United States Patent
Brunelli et al.

(10) Patent No.: US 9,995,448 B2
(45) Date of Patent: Jun. 12, 2018

(54) FRONT ACCESS BATTERY COMPARTMENT

(71) Applicant: Hubbell Incorporated, Shelton, CT (US)

(72) Inventors: Anthony Louis Brunelli, Piedmont, SC (US); Robert Richard Papstein, Greenville, SC (US)

(73) Assignee: Hubbell Incorporated, Shelton, CT (US)

( * ) Notice: Subject to any disclaimer, the term of this patent is extended or adjusted under 35 U.S.C. 154(b) by 0 days. days.

(21) Appl. No.: 15/165,765

(22) Filed: May 26, 2016

(65) Prior Publication Data
US 2016/0312968 A1    Oct. 27, 2016

Related U.S. Application Data

(63) Continuation of application No. 14/955,497, filed on Dec. 1, 2015.

(60) Provisional application No. 62/088,247, filed on Dec. 5, 2014.

(51) Int. Cl.
| | | |
|---|---|---|
| *G09F 13/04* | (2006.01) | |
| *F21S 9/02* | (2006.01) | |
| *F21V 15/01* | (2006.01) | |
| *F21V 23/02* | (2006.01) | |
| *H05K 5/02* | (2006.01) | |
| *H05K 5/03* | (2006.01) | |
| *F21V 21/28* | (2006.01) | |
| *F21V 23/06* | (2006.01) | |
| *F21V 33/00* | (2006.01) | |
| *H01M 2/10* | (2006.01) | |
| *F21W 111/00* | (2006.01) | |

(52) U.S. Cl.
CPC .............. *F21S 9/024* (2013.01); *F21V 15/01* (2013.01); *F21V 21/28* (2013.01); *F21V 23/023* (2013.01); *F21V 23/06* (2013.01); *F21V 33/0076* (2013.01); *G09F 13/0413* (2013.01); *H01M 2/1022* (2013.01); *H05K 5/0217* (2013.01); *H05K 5/0247* (2013.01); *H05K 5/03* (2013.01); *F21W 2111/00* (2013.01); *G09F 2013/0459* (2013.01)

(58) Field of Classification Search
CPC .................... F21S 9/024; G09F 2013/0459
See application file for complete search history.

(56) References Cited

U.S. PATENT DOCUMENTS

| | | |
|---|---|---|
| 2,097,237 A | 10/1937 | Hulst |
| 2,478,129 A | 8/1949 | Powell |
| 4,271,621 A | 6/1981 | Garcia et al. |
| 4,435,743 A | 3/1984 | Plumly |
| 5,018,290 A | 5/1991 | Kozek et al. |
| 5,148,158 A * | 9/1992 | Shah .................... G08B 29/126 315/86 |
| 5,299,702 A | 4/1994 | Kneer et al. |
| 5,539,623 A | 7/1996 | Gurz et al. |

(Continued)

*Primary Examiner* — Joanne Silbermann
(74) *Attorney, Agent, or Firm* — Michael Best & Friedrich, LLP (57) ABSTRACT

An emergency lighting device includes a housing containing a high voltage connection. A light emitter is connected to the housing. A compartment in the housing having an opening is separated from the high voltage connection. A battery is positioned in the compartment and accessible through the opening.

29 Claims, 10 Drawing Sheets

(56) References Cited

U.S. PATENT DOCUMENTS

| | | | | |
|---|---|---|---|---|
| 5,564,442 | A | * | 10/1996 | MacDonald ............ A24F 13/00 |
| | | | | 131/194 |
| 5,768,814 | A | * | 6/1998 | Kozek ..................... G09F 13/04 |
| | | | | 362/183 |
| 5,797,673 | A | | 8/1998 | Logan et al. |
| 5,911,499 | A | | 6/1999 | Stafford et al. |
| 6,019,477 | A | | 2/2000 | Wegrzyn et al. |
| 6,606,808 | B2 | | 8/2003 | Katz |
| 7,439,463 | B2 | * | 10/2008 | Brenner ............... A61C 1/0023 |
| | | | | 200/86.5 |
| D627,916 | S | | 11/2010 | Butteris et al. |
| 7,867,646 | B2 | * | 1/2011 | Rhodes ................ F24F 11/0012 |
| | | | | 236/1 C |
| 8,083,376 | B2 | | 12/2011 | Chien |
| D660,491 | S | | 5/2012 | Holscher |
| D679,759 | S | | 4/2013 | Brunelli et al. |
| 9,247,625 | B2 | | 1/2016 | Recker et al. |
| 2010/0039792 | A1 | * | 2/2010 | Meyers .................... F21L 2/00 |
| | | | | 362/20 |
| 2010/0325923 | A1 | * | 12/2010 | Dial ......................... G09F 3/12 |
| | | | | 40/124.03 |
| 2012/0314344 | A1 | | 12/2012 | Lam et al. |

* cited by examiner

FRONT ACCESS BATTERY COMPARTMENT

RELATED APPLICATION(S)

This application is a continuation of U.S. application Ser. No. 14/955,497, filed Dec. 1, 2015, which is based on provisional application Ser. No. 62/088,247, filed Dec. 5, 2014, the disclosure of which are incorporated herein by reference in their entirety and to which priority is claimed.

FIELD

Various exemplary embodiments relate to front access battery compartments for lighting assemblies and signs.

BACKGROUND

Emergency units, such as exit signs and light fixtures, are commonly used in public buildings to indicate and illuminate areas such as stairs and exits in the event of a power failure. These fixtures typically have an emergency backup power system such as a battery that automatically turns on the emergency light when the primary power source is interrupted.

Once an emergency unit is installed, the batteries need to be replaced every 3 to 5 years. Access to the batteries inside the emergency unit is gained by removing the main front cover to the entire emergency unit. Removing the main front cover exposes the person replacing the battery to voltages from several sources, including line voltage and high voltage from the transformer. Emergency unit batteries should therefore only be replaced by qualified technicians to avoid harm, including electrical shock and death, and damage to the equipment.

SUMMARY

According to an exemplary embodiment, an emergency signaling device includes a housing containing a high voltage connection. A light emitter is connected to the housing. A compartment in the housing having an opening is separated from the high voltage connection. A battery is positioned in the compartment and accessible through the opening.

According to another exemplary embodiment, an emergency light includes a housing, a lamp, a compartment, a battery, and a door. The housing has a front wall and the lamp is connected to the housing. The compartment is positioned in the housing and has an opening accessible through the front wall of the housing. The battery is positioned in the compartment. The door is connected to the housing and covers the compartment opening when in a closed position.

According to another exemplary embodiment, an emergency sign includes an illuminated housing having a faceplate with indicia. A compartment is positioned in the housing and has an opening accessible through the faceplate of the housing. At least one battery is positioned in the compartment. A door is connected to the housing and covers the compartment opening when in a closed position.

BRIEF DESCRIPTION OF THE DRAWINGS

The aspects and features of various exemplary embodiments will be more apparent from the description of those exemplary embodiments taken with reference to the accompanying drawings, in which.

DETAILED DESCRIPTION OF EXEMPLARY EMBODIMENTS

According to various exemplary embodiments, an emergency signaling device includes a compartment that allows a user to easily access and replace a battery without exposure to dangerous conditions, such as high voltage sources. The emergency signal emitter can be audio or visual. For example, a front access compartment with a cover can be used to allow access to the battery separate from supply power wiring, eliminating the installer's exposure to high voltages. In various exemplary embodiments, the emergency unit can be a lighting unit that contains a light emitter or other device that requires battery backup, including an emergency lighting assembly, an emergency exit sign, or other emergency devices.

FIGS. 1-10 show an exemplary embodiment of an emergency lighting assembly 10. The lighting assembly includes a housing 12, one or more lamps 14, and a door 16 covering a battery compartment 18.

The housing 12 in the illustrated exemplary embodiment has a front wall 20, inclined side walls 22, an inclined top wall 24, and an inclined bottom wall 26. Rounded corners 28 or other transitions can connect the walls. One or more of the walls 22, 24, 26 can include one or more knockouts 29. For example, a knockout 29 can be positioned in both of the side walls 22 and the top wall 24. The knockouts 29 can be selectively removed to provide one or more wire openings for the housing 12.

Figure 1:
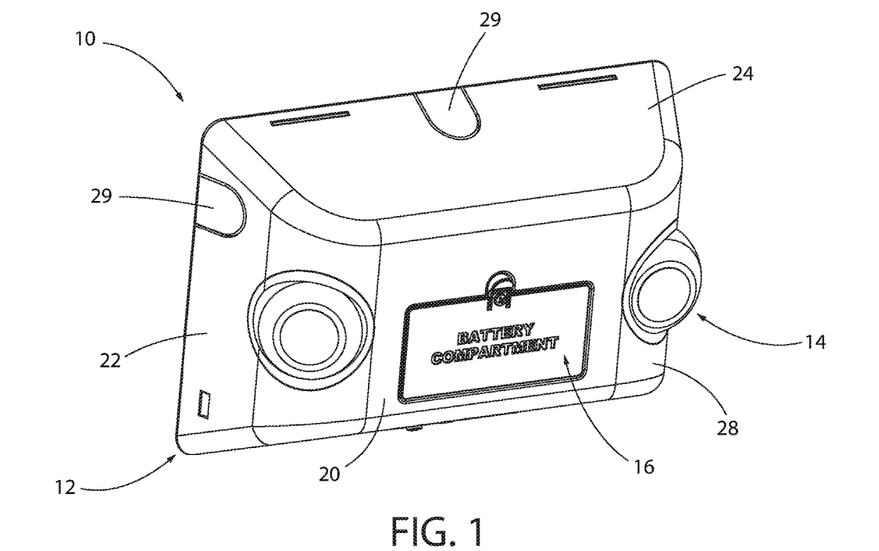
FIG. 1 is a top perspective view of an exemplary emergency light assembly.
Figure 2:
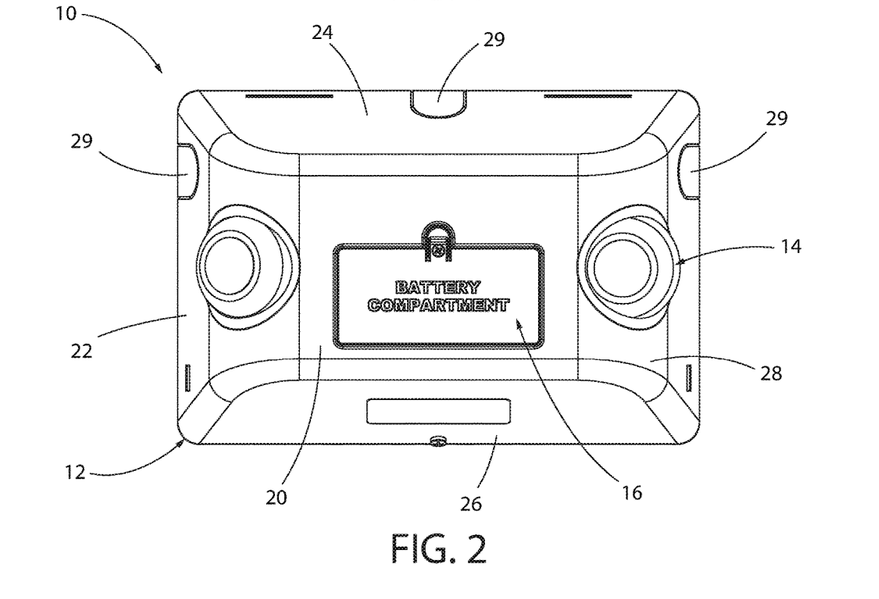
FIG. 2 is a front view of the light assembly of FIG. 1.
Figure 3:
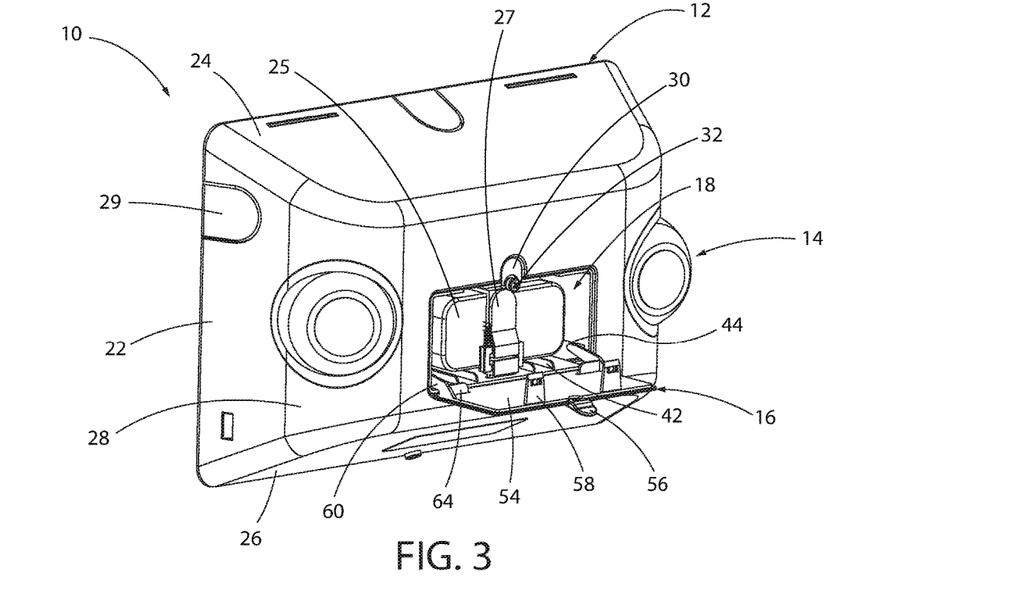
FIG. 3 is a top perspective view of the light assembly of FIG. 1 with the compartment door in the open position.
Figure 4:
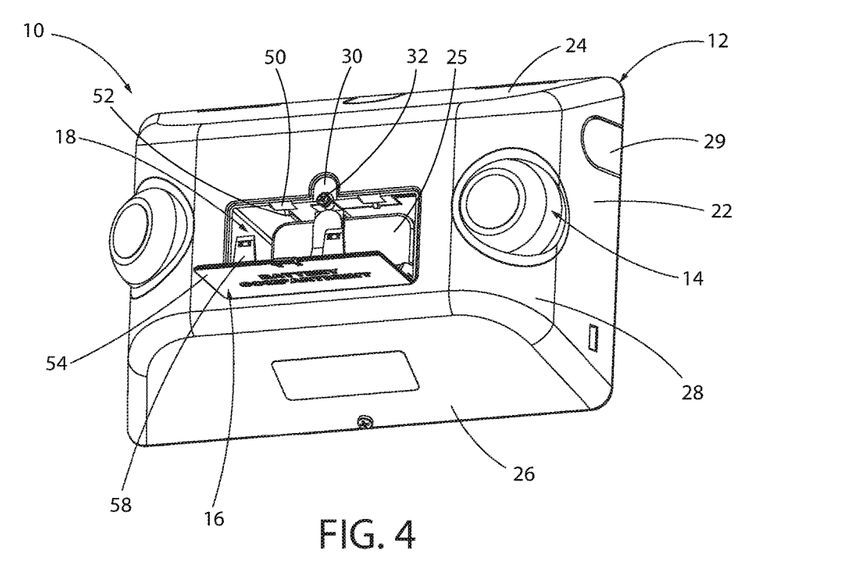
FIG. 4 is a bottom perspective view of the light assembly of FIG. 3.
Figure 5:
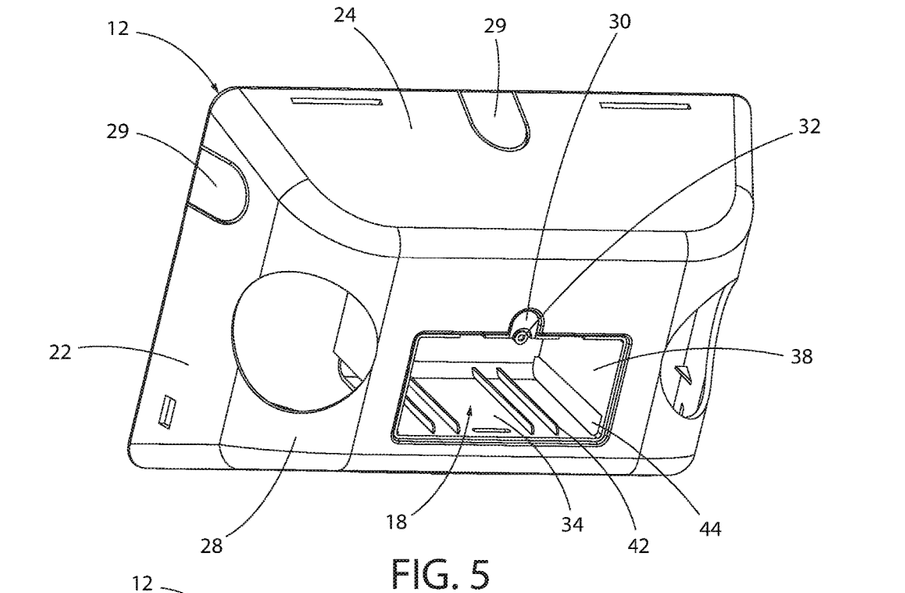
FIG. 5 is a top perspective view of the housing of the light assembly of FIG. 1.
Figure 6:
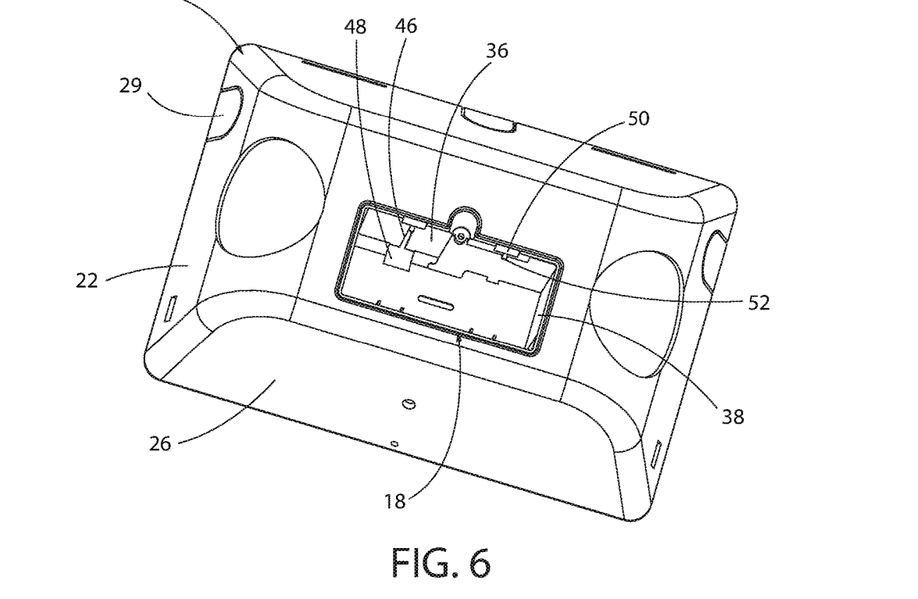
FIG. 6 is a bottom perspective view of the housing of FIG. 5.

The lamps 14 extend through openings in the housing, for example, positioned mainly in the rounded corners 28. Side walls 22 are oriented at an incline with respect to the front wall 20 to direct light in a generally outward and forward direction with respect to the housing 12. The housing 12 and lamp 14 can have various alternative configurations depending on the desired light output, strength, and direction. The housing 12 can be made from a molded plastic material, metal, composite, or other suitable rigid material.

Each of the lamps 14 can be independently adjusted to direct the beam of light produced from the lamp 14 to a selected area. In an exemplary embodiment, the lamps 14 can pivot and swivel within a socket in the housing 12. The lamps 14 can include any suitable light source, for example light emitting diodes (LED) or halogen light sources.

The light assembly 10 is connected to a main power source (not shown) and includes a battery 25 for providing auxiliary power. In an exemplary embodiment, the internal circuitry and the lamps 14 are connected to the battery by wires or another electrical connection. The light assembly 10 is then connected to a main power source to maintain the battery 25 in a charged condition. Typically, the light assembly 10 is wired to an electrical junction box or electrical receptacle as known in the art. Circuitry actuates the lamps 14 when certain conditions are present, for example an alarm is activated or the primary source of power is interrupted.

As best shown in FIGS. 3-6, the exemplary housing includes a compartment 18 for housing the battery 25. The compartment 18 is accessible through the front of the housing 12 without removing the housing 12 or otherwise exposing high voltage components, such as conductors or circuitry. The compartment 18 is covered by a moveable door 16 that can be selectively opened and closed by a user. The battery 25 can be secured in the housing 12 by a strap 27. The strap 27 can be feed through one or more slots in the compartment 18. The strap 27 can utilize a releasable fastener, for example a hook-and-loop fastener, buckle, clip, etc.

The front wall 20 includes a depression 30 adjacent the compartment 18 opening and a boss 32 extending into the compartment 18. The compartment 18 includes a bottom wall 34, top wall 36, side walls 38 extending from the front wall 20 toward the rear of the housing 12, and a back wall 40 connected to one or more of the other walls 34, 36, 38. The top wall 36 can include an undercut portion and the back wall 40 can include a slot for receiving the strap 27.

Figure 7:
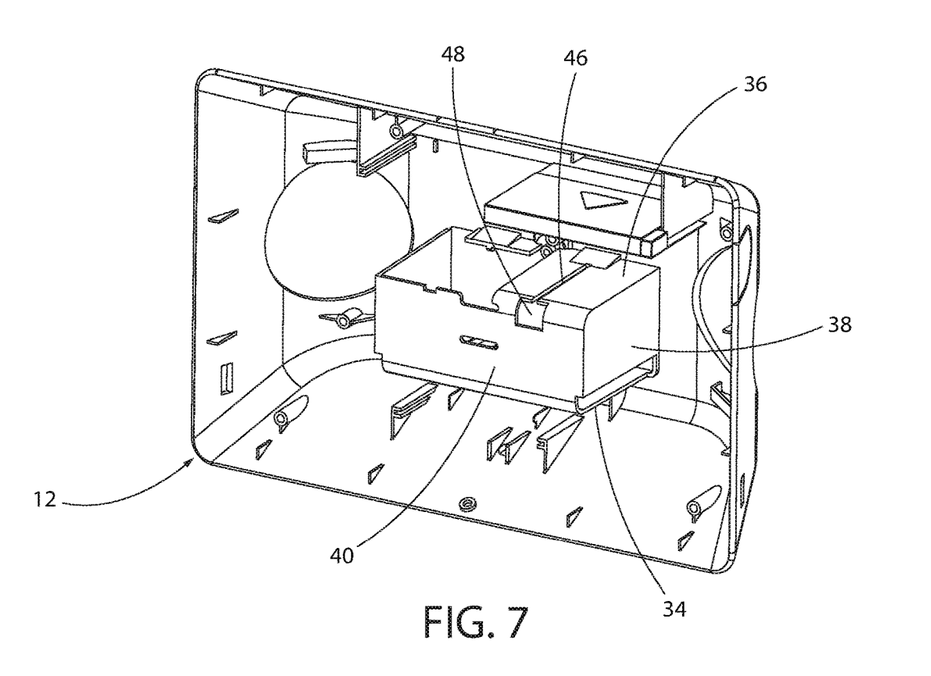
FIG. 7 is a rear perspective view of the housing of FIG. 5.
Figure 8:
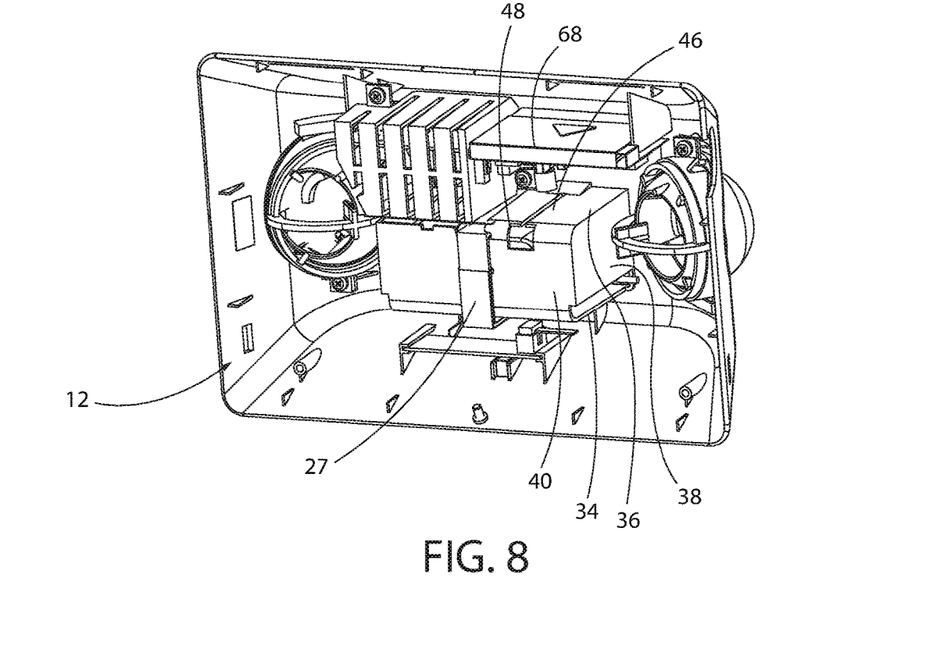
FIG. 8 is a rear perspective view of the light assembly of FIG. 1.

In an exemplary embodiment, the bottom wall 34 includes one or more sets of protrusions 42 defining a groove. Slots 44 are positioned adjacent the bottom wall 34 and the side walls 38 to retain the door 16. The top wall 36 extends at least partially over the compartment 18 and includes a channel 46 and an aperture 48 that extends into and through the back wall 40 as best shown in FIGS. 7 and 8. One or more angled grooves 50 and projections 52 are provided in the compartment 18. For example a first angled groove 50 and projection 52 are provided on the top wall 36 and a second angled groove 50 and projection 52 are provided on a flange extending over the compartment 18. The grooves 50 and projections 52 are configured to engage the door 16.

Figures 9, 10, 11:
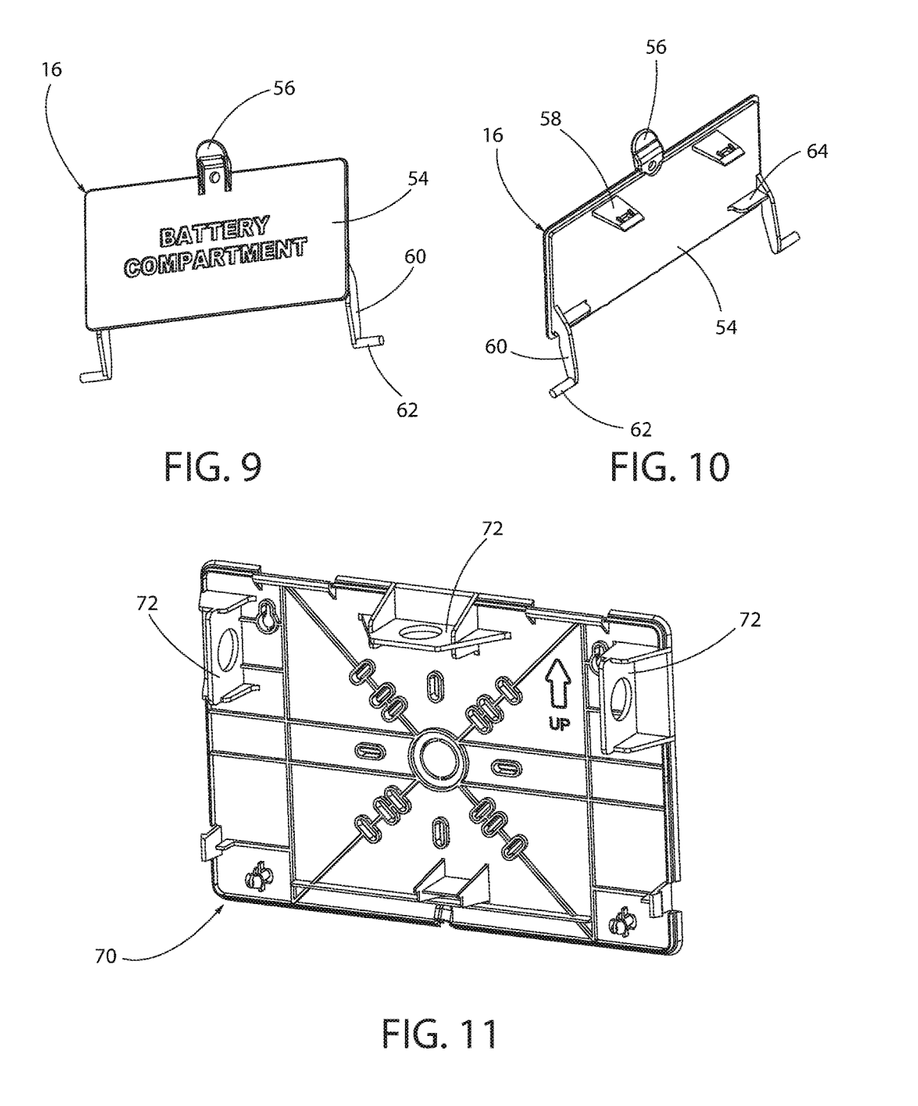
FIG. 9 is a front perspective view of the door of FIG. 1.
FIG. 10 is a rear perspective view of the door of FIG. 9.
FIG. 11 is a perspective view of an exemplary mounting plate.

The door 16, according to the exemplary embodiment and best shown in FIGS. 9 and 10 includes a cover 54 having a front surface and a back surface. An angled tab 56 extends upward from the cover 54, although other alternative configurations may be used. One or more clips 58, for example first and second clips 58 having an opening, extend rearward from the back surface of the cover 54. First and second legs 60 extend downward from the back surface of the cover 54. A pin 62 extends from each of the first and second legs 60. Flaps 64 extend from the back surface of the cover 54. The cover can be made from a variety of materials, including non-conductive materials such as molded plastic, although other rigid materials may be used.

The pins 62 extend into the slots 44 to pivotally connect the door 16 to the housing 12. When the door 16 is in the closed position, the clips 58 engage the grooves 50 and projections 52 and the tab 56 rests in the depression 30. The projections 52 extend into the openings of the clips 58 to releasable secure the door 16 in the closed position. A fastener, for example a screw, can be inserted through the tab 56 and into the boss 32 to secure the cover 16 to the housing 12. The tab 56 can include an aperture for receiving the screw. Other connections, including other hinge or pivotal connections or a non-hinged, separable connection can be made between the door 16 and the housing 12.

Figure 11A:
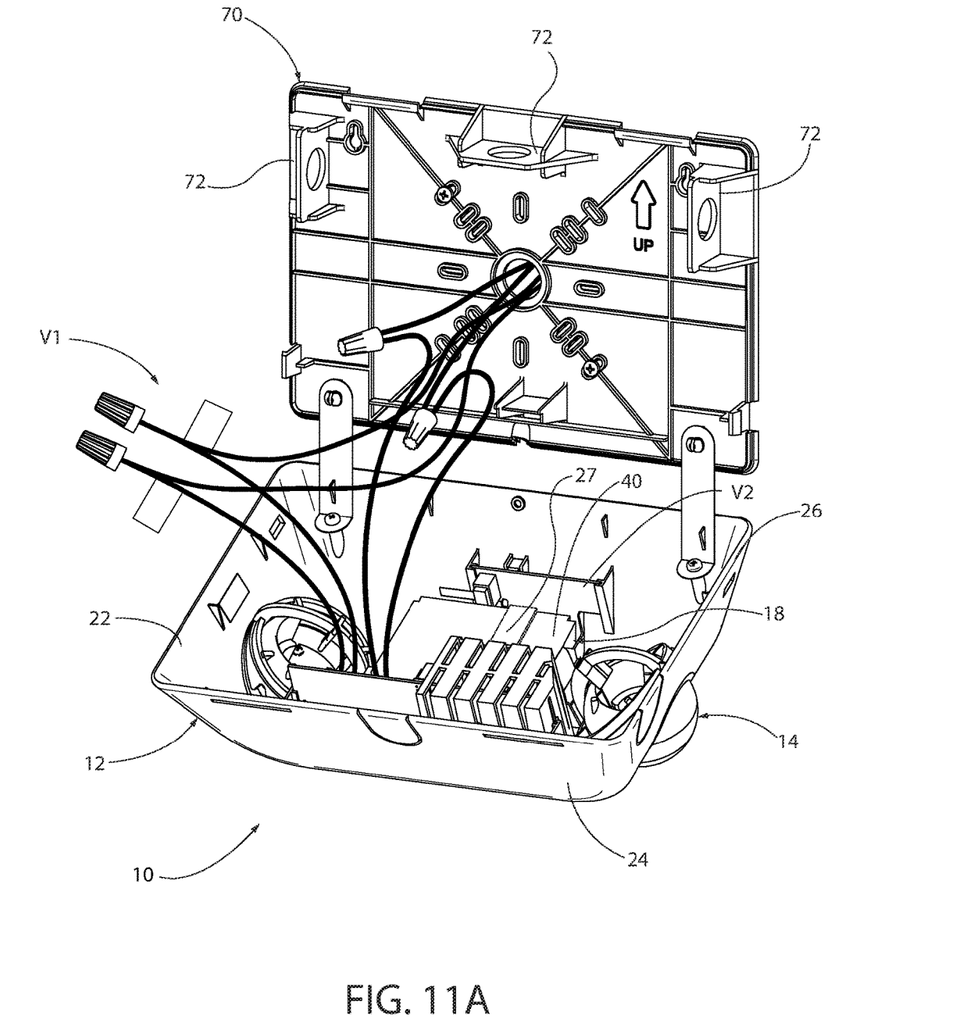
FIG. 11A is a perspective view of the light assembly partially connected to the mounting plate of FIG. 11.

The compartment 18 holds the battery 25 but isolates and/or limits an installer from touching high voltage components, such as power supply conductors V1 or charging circuits V2 inside the housing 12 as shown in FIG. 11A. The battery's low voltage is supplied to the main unit via wires that are routed through an opening in the back of the battery compartment. The battery 25 can therefore be easily changed by a user without moving the housing 12 and without risk to injury.

As best shown in FIG. 7, the interior of the housing 12 includes various structural elements to secure required electrical components and the battery 25. The light assembly 10 contains suitable electrical components for powering and activating the lamps 14, for example electrical conductors and circuitry as shown in FIG. 8 and would be understood by one of ordinary skill in the art. Certain components, including portions of the wiring have been removed from FIG. 8 for clarity.

In an exemplary embodiment, a charger 68, for example a PCB mounted charger, is secured to the housing 12. The charger 68 can include an electrical connector that extends into the compartment 18, for example through the channel 46 or aperture 48. The electrical connector can be a series of wire conductors and a wire harness connector, although other suitable types of electrical connectors, including wire conductors or other releasable connectors can be used FIG. 11 shows an exemplary mounting plate 70 that can be used with the housing 12. The mounting plate 70 is attached to a support, for example a wall, ceiling or other structure. The interior of the housing 12 can include one or more mounting features, for example protrusions, bosses, slots, pins, clips, or any combination thereof that allow the housing 12 to connect to a mounting plate 70. The housing 12 can releasably connect to the mounting plate 70, for example through a snap connection. The mounting plate 70 has various mounting features, for example for example protrusions, bosses, slots, pins, clips, or any combination thereof to engage the housing 12. One or more hinge members can also be provided to allow the mounting plate 70 to pivot with respect to the housing 12. The mounting plate 70 includes tabs 72 that have openings that align with the knockouts 29. In other alternative embodiments, the housing 12 can be connected to the mounting plate, or directly to a structure, with straps or fasteners.

Figure 12:
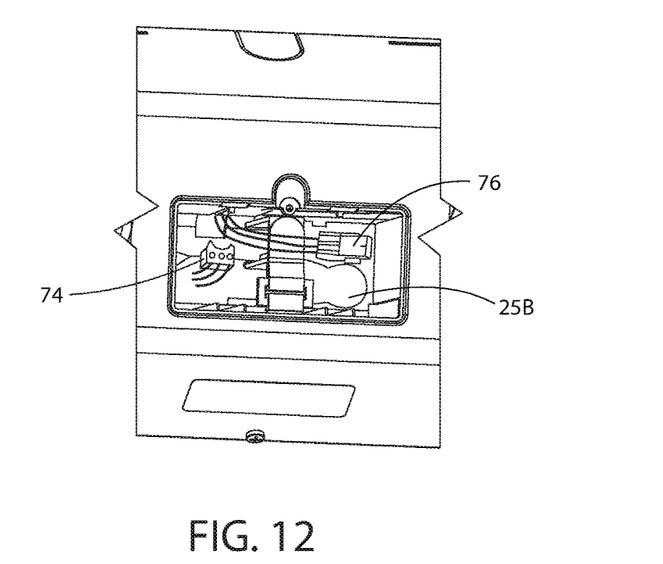
FIG. 12 is a partial perspective view of the light assembly of FIG. 1 with an alternative exemplary battery and wire connector.

FIG. 12 shows an alternative embodiment of a multiple cell battery pack 25B with an attached connector 74. The battery connector 74 can be a series of wire conductors and a wire harness connector as shown, although other suitable type of electrical connectors, including wire conductors or other releasable connectors can be used. The battery 25B is placed in the compartment 18 and the battery connector 74 is coupled to a charger connector 76, allowing the battery 25B to be charged by the charger 68 and allowing the battery 25B to provide electrical power to the lamps 14.

Figure 13:
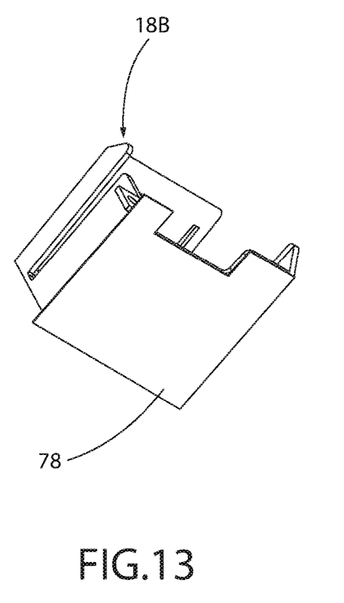
FIG. 13 is a bottom perspective view of an alternative exemplary compartment.
Figure 14:
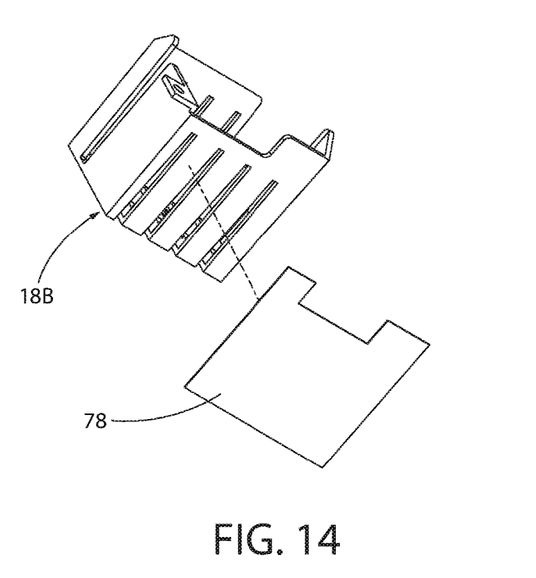
FIG. 14 is an exploded perspective view of FIG. 12.

FIGS. 13 and 14 show an exemplary embodiment of the battery compartment 18B that is separately formed and can be attached to a housing, for example through fasteners, adhesives, or a joining process. The compartment 18B includes a cover 78 to assist in shielding the interior of the compartment 18B.

Figure 15:
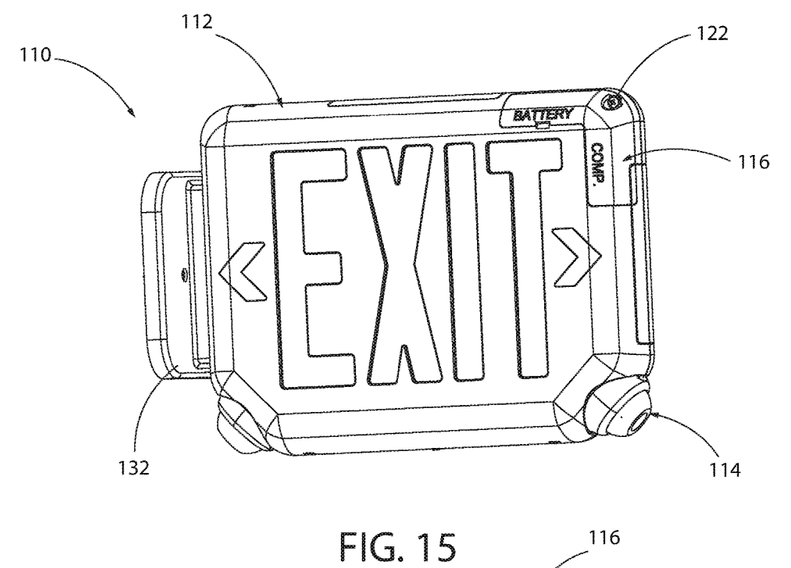
FIG. 15 is a front perspective view of an alternative exemplary emergency light assembly.
Figure 16:
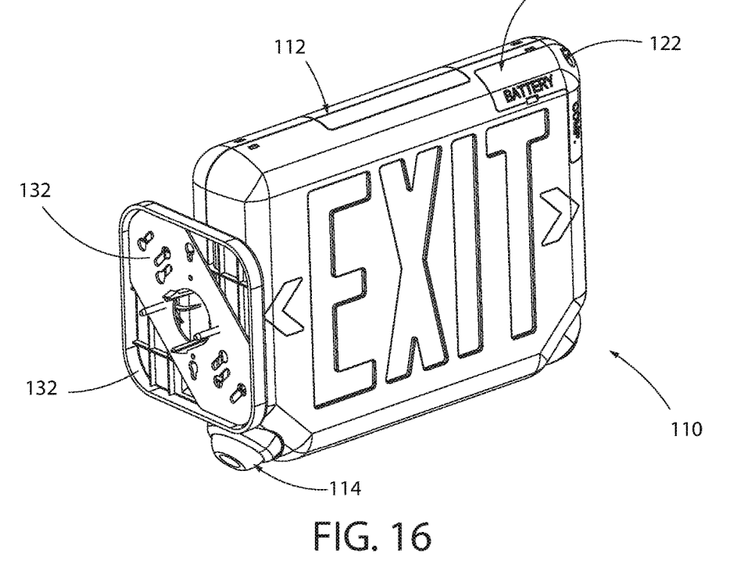
FIG. 16 is side perspective view of the light assembly of FIG. 14.
Figure 17:
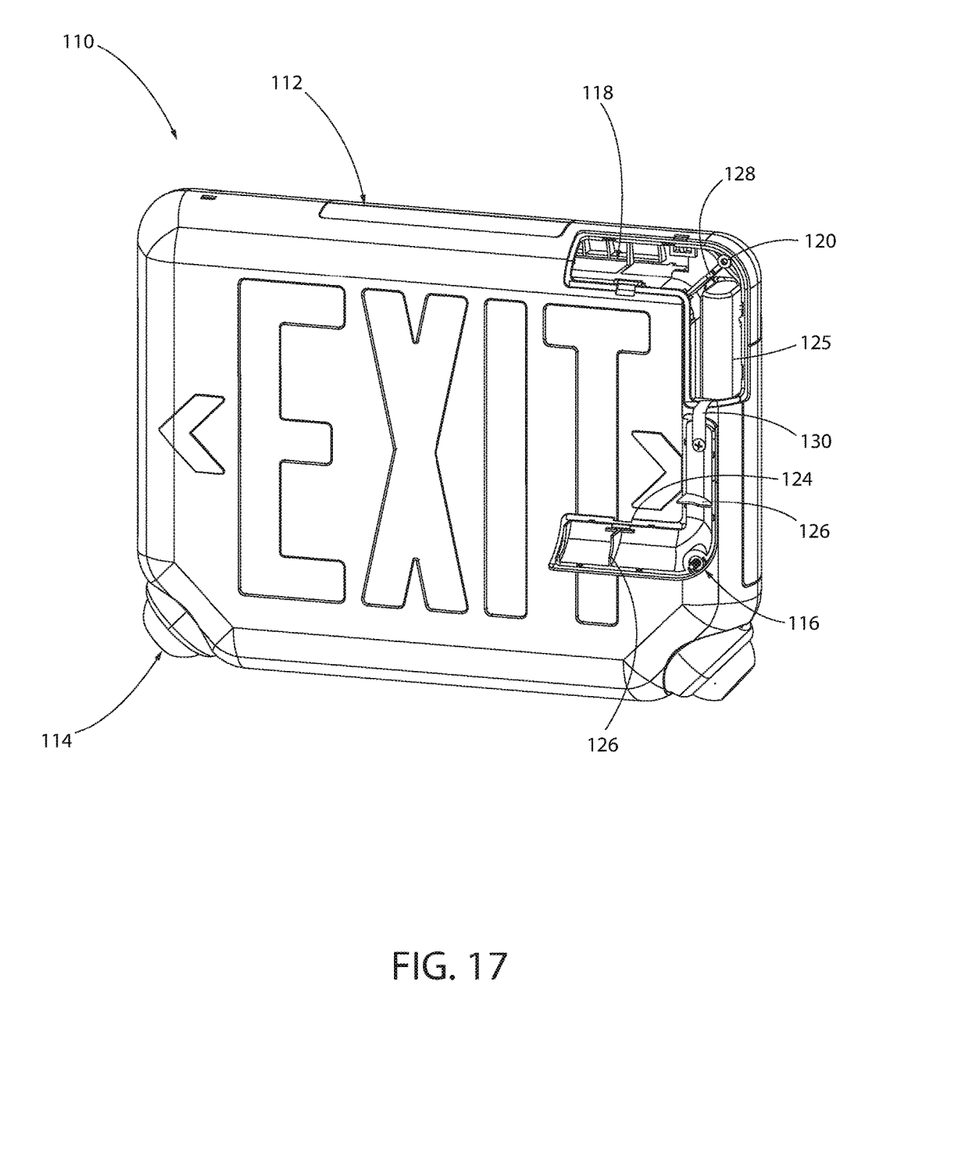
FIG. 17 is a front perspective view of the light assembly of FIG. 14 with the door and one battery removed.
Figure 18:
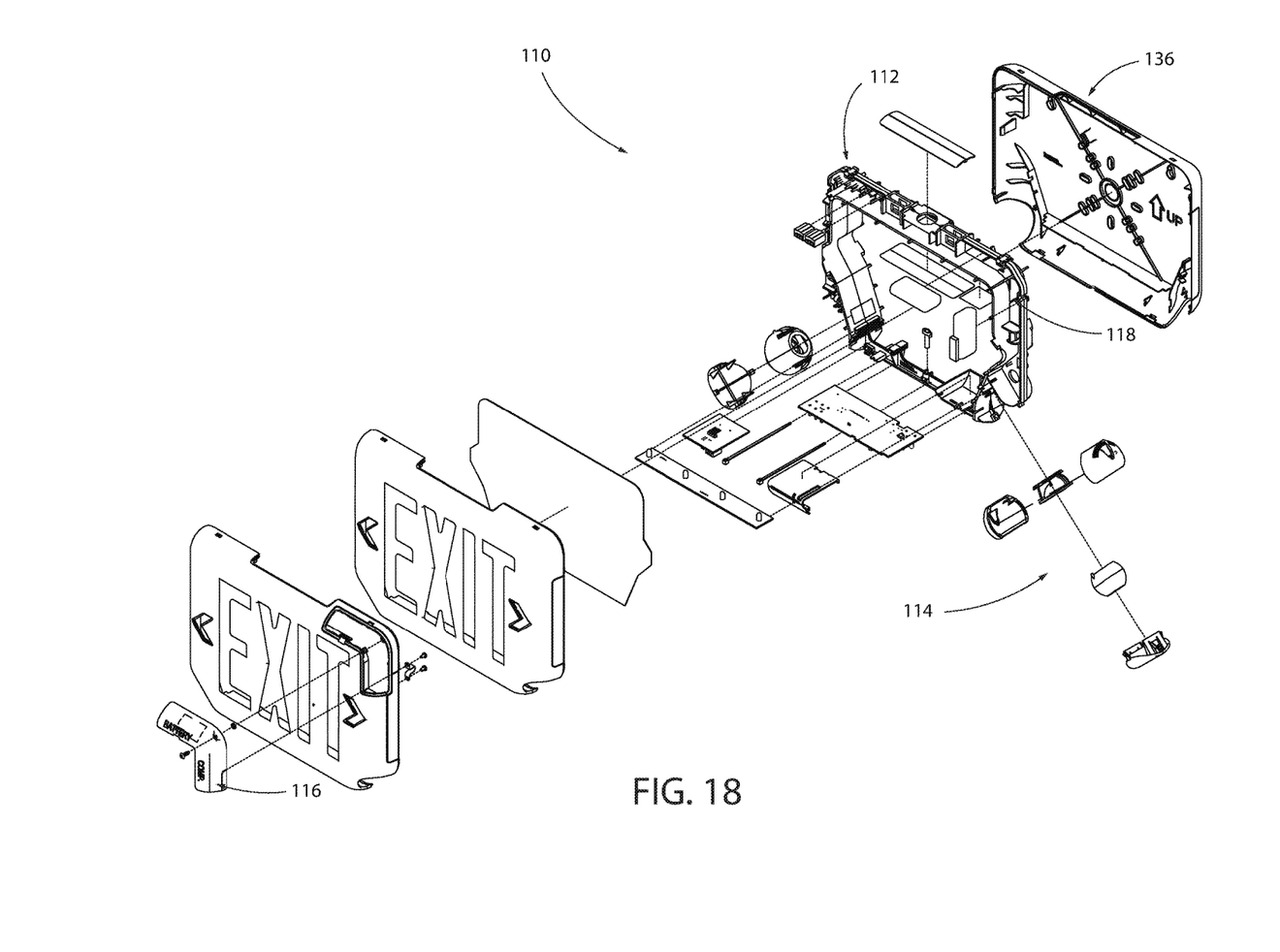
FIG. 18 is a perspective exploded view of the light assembly of FIG. 14.

FIGS. 15-18 show another exemplary embodiment of a lighting assembly that is an illuminated emergency exit sign 110. FIGS. 15 and 16 show an exemplary embodiment of the exit sign 110 that includes a side mounting extension 132 and bracket 134. FIGS. 17 and 18 show an exemplary embodiment of the exit sign 110 having a rear mounting plate 136.

The exit sign 110 includes a housing 112, one or more lamps 114, and a door 116 covering a battery compartment 118. The door 116 and the battery compartment 118 have a substantially L shape. The battery compartment 118 houses first and second batteries 125. The battery compartment 118 includes a threaded aperture 120 that receives a fastener 122 extending through the door 116. The door 116 has an outer flange that mates with a recess in the housing 112 so that the door 116 fits flush against the housing. A slot 124 is provided in the door 116 so it can be removed from the housing by a user after the fastener 122 has been removed. The door 116 includes a set of first flanges 126 that hold the battery 125 in place and the compartment 118 includes a second flange 128 that separates the first and second batteries 125. The batteries 125 can be connected through a wire harness, contacts, or other suitable electrical connection. In an exemplary embodiment, a strip 130 connects to the door 116 and the compartment 118 to assist in retaining the door 116 when it is removed from the compartment 118.

The foregoing detailed description of the certain exemplary embodiments has been provided for the purpose of explaining the principles of the invention and its practical application, thereby enabling others skilled in the art to understand the invention for various embodiments and with various modifications as are suited to the particular use contemplated. This description is not necessarily intended to be exhaustive or to limit the invention to the exemplary embodiments disclosed. Any of the embodiments and/or elements disclosed herein may be combined with one another to form various additional embodiments not specifically disclosed. Accordingly, additional embodiments are possible and are intended to be encompassed within this specification and the scope of the appended claims. The specification describes specific examples to accomplish a more general goal that may be accomplished in another way.

As used in this application, the terms "front," "rear," "upper," "lower," "upwardly," "downwardly," and other orientational descriptors are intended to facilitate the description of the exemplary embodiments of the present invention, and are not intended to limit the structure of the exemplary embodiments of the present invention to any particular position or orientation. Terms of degree, such as "substantially" or "approximately" are understood by those of ordinary skill to refer to reasonable ranges outside of the given value, for example, general tolerances associated with manufacturing, assembly, and use of the described embodiments.

What is claimed:

1. An emergency lighting device comprising:
   a housing having a first outer surface, a second outer surface including an opening, a first interior compartment, and a second interior compartment accessible through the opening;
   a first moveable light emitter connected to the housing;
   a second moveable light emitter connected to the housing;
   a high-voltage component in the first compartment for receiving a high voltage connection;
   a rechargeable battery positioned in the second compartment; and
   a door connected to the housing and moveable between a first position covering the opening and a second position providing access to the second compartment but not the first compartment, wherein the second compartment is isolated from all high-voltage components, and a low-voltage conductor extends from the second compartment into the first compartment.

2. The emergency lighting device of claim 1, wherein the battery is charged by a power supply and provides auxiliary power to the first and second light emitters.

3. The emergency lighting device of claim 1, wherein the first and second light emitters are pivotally connected to the housing.

4. The emergency lighting device of claim 1, further comprising a strap for retaining the battery.

5. The emergency lighting device of claim 1, wherein a threaded fastener secures the door in the closed position.

6. The emergency lighting device of claim 1, wherein the door includes a tab.

7. The emergency lighting device of claim 1, wherein the low voltage conductor is connected to the battery by a wire harness.

8. The emergency lighting device of claim 1, wherein the second interior compartment includes a top wall, a bottom wall, and a side wall.

9. The emergency lighting device of claim 1, wherein the high-voltage component includes a conductor.

10. An emergency light comprising:
    a housing having a front wall at least partially defining an opening and a battery compartment accessible through the opening;
    a moveable light emitter connected to the housing having at least one light emitting diode;
    a high-voltage conductor for receiving a mains power supply, the high-voltage conductor positioned in the housing and inaccessible through the opening;
    a moveable door connected to the housing having a first position covering the opening and a second position allowing access to the battery compartment, wherein the battery compartment is isolated from all high-voltage components, and a low-voltage conductor extends from the battery compartment.

11. The emergency light of claim 10, wherein the door is secured in the closed position by a threaded fastener.

12. The emergency light of claim 10, wherein the battery compartment is physically and electrically separated from the connection for receiving the mains power supply.

13. The emergency light of claim 10, further comprising a strap for retaining a battery in the battery compartment.

14. The emergency light of claim 10, further comprising a mounting plate connected to the housing.

15. The emergency light of claim 10, wherein the front wall includes a first inclined surface and a second inclined surface.

16. The emergency light of claim 10, wherein a battery is positioned in the battery compartment.

17. The emergency light of claim 16, wherein the battery is a multi-cell battery.

18. The emergency light of claim 10, wherein the battery compartment includes a top wall, a bottom wall, a side wall, and a back wall.

19. An emergency lighting device comprising:
a housing having a first outer surface, a second outer surface, and an opening in the second outer surface;
a first moveable light emitter connected to the housing;
a second moveable light emitter connected to the housing;
a high-voltage component in a first compartment for receiving a high-voltage connection;
a battery positioned in a second compartment; and
a door connected to the housing and moveable between an open position and a closed position,
wherein in the closed position the door prevents access to the battery, in the open position the battery is accessible through the opening, and wherein the second compartment is isolated from all high-voltage components.

20. The emergency lighting device of claim 19, wherein the high-voltage connection includes a mains power supply connection.

21. The emergency lighting device of claim 19, wherein a threaded fastener secures the door in the closed position.

22. The emergency lighting device of claim 19, further comprising a battery compartment positioned in the housing.

23. The emergency light of claim 22, wherein the battery compartment includes a top wall, a bottom wall, a side wall, and a back wall.

24. The emergency lighting device of claim 19, wherein the high-voltage component includes a conductor.

25. The emergency lighting device of claim 19, wherein the high-voltage component includes a charging circuit.

26. An emergency lighting device comprising:
a housing having an opening and a battery compartment accessible through the opening, the battery compartment including a top wall, a bottom wall, a back wall, and a side wall;
a first moveable light emitter connected to the housing having a first light emitting diode;
a second moveable light emitter connected to the housing having a second light emitting diode;
a high-voltage component positioned in the housing for receiving a high voltage connection;
a multi-cell, rechargeable battery positioned in the battery compartment;
a strap positioned in the battery compartment to retain the battery;
a low-voltage conductor connected to the battery through a wire harness and extending through an opening in the battery compartment; and
a door connected to the housing and moveable between a first position covering the opening and a second position providing access to the battery compartment but not the high-voltage component, wherein the battery compartment is isolated from all high-voltage components.

27. The emergency lighting device of claim 26, wherein the high-voltage component includes a high-voltage conductor.

28. The emergency lighting device of claim 26, wherein the high-voltage component includes a charging circuit.

29. The emergency lighting device of claim 26, wherein a threaded fastener secures the door in the closed position.

* * * * *